United States Patent
Hu et al.

(10) Patent No.: US 7,250,081 B2
(45) Date of Patent: Jul. 31, 2007

(54) METHODS FOR REPAIR OF SINGLE CRYSTAL SUPERALLOYS BY LASER WELDING AND PRODUCTS THEREOF

(75) Inventors: Yiping Hu, Greer, SC (US); William F. Hehmann, Greer, SC (US); Murali Madhava, Gilbert, AZ (US)

(73) Assignee: Honeywell International, Inc., Morristown, NJ (US)

( * ) Notice: Subject to any disclaimer, the term of this patent is extended or adjusted under 35 U.S.C. 154(b) by 348 days.

(21) Appl. No.: 10/728,543

(22) Filed: Dec. 4, 2003

(65) Prior Publication Data

US 2005/0120941 A1 Jun. 9, 2005

(51) Int. Cl.
*C30B 33/06* (2006.01)

(52) U.S. Cl. .................. 117/1; 117/4; 117/7; 117/9; 117/903; 117/904; 117/905

(58) Field of Classification Search .................. 117/1, 117/4, 7, 9, 903, 904, 905, 913
See application file for complete search history.

(56) References Cited

U.S. PATENT DOCUMENTS

| | | | |
|---|---|---|---|
| 3,759,707 A | 1/1971 | Hockin et al. | |
| 3,744,996 A | 7/1973 | Shaw et al. | |
| 3,807,993 A | 4/1974 | Dalai et al. | |
| 3,890,816 A | 6/1975 | Allen et al. | |
| 3,902,862 A | 9/1975 | Moll et al. | |
| RE29,920 E | 2/1979 | Baldwin | |
| 4,292,076 A | 9/1981 | Gigliotti et al. | |
| 4,492,672 A | 1/1985 | Duhl et al. | |
| 4,569,824 A | 2/1986 | Duhl et al. | |
| 4,777,017 A | 10/1988 | Khan et al. | |
| 4,853,044 A | 8/1989 | Ford et al. | |
| 4,981,664 A | 1/1991 | Chieng | |
| 5,043,138 A | 8/1991 | Darolia et al. | |
| 5,071,059 A * | 12/1991 | Heitman et al. ............ 228/244 |
| 5,154,884 A | 10/1992 | Wukusick et al. | |
| 5,294,239 A | 3/1994 | Zoltzer et al. | |
| 5,374,319 A | 12/1994 | Stueber et al. | |

(Continued)

FOREIGN PATENT DOCUMENTS

EP 0 503 698 A1 8/1992

(Continued)

OTHER PUBLICATIONS

Hirose, Nakamura, Yanagawa, and Kobayashi, "Microstructure and Mechanical Property of Laser Welds of Single Crystal Nickel Base Superalloy CMSX-4", Materials Science Forum, 2003, pp. 4007-4012, vol. 426-432.

*Primary Examiner*—Felisa Hiteshew
(74) *Attorney, Agent, or Firm*—Ingrassia Fisher & Lorenz

(57) ABSTRACT

Methods for repair of single crystal superalloys by laser welding and products thereof have been disclosed. The laser welding process may be hand held or automated. Laser types include: $CO_2$, Nd:YAG, diode and fiber lasers. Parameters for operating the laser process are disclosed. Filler materials, which may be either wire or powder superalloys are used to weld at least one portion of a single crystal superalloy substrate.

28 Claims, 3 Drawing Sheets
(2 of 3 Drawing Sheet(s) Filed in Color)

U.S. PATENT DOCUMENTS

| | | |
|---|---|---|
| 5,431,750 A | 7/1995 | Kawai et al. |
| 5,584,663 A | 12/1996 | Schell et al. |
| 5,624,721 A | 4/1997 | Strangman |
| 6,024,792 A | 2/2000 | Kurz et al. |
| 6,210,635 B1 | 4/2001 | Jackson et al. |
| 6,573,471 B1 | 6/2003 | Kuriyama et al. |

FOREIGN PATENT DOCUMENTS

| | | |
|---|---|---|
| EP | 0 740 977 A1 | 11/1996 |
| JP | 2001 269784 | 10/2001 |
| WO | WO 03/087439 A1 | 10/2003 |
| WO | 2004040295 | 8/2005 |

\* cited by examiner ated-temperature properties (both environment-resistant and creep-resistant properties, etc.), advanced superalloy filler materials are laser deposited onto worn or damaged areas of the components. Thus damaged advanced turbine superalloy (directionally

METHODS FOR REPAIR OF SINGLE CRYSTAL SUPERALLOYS BY LASER WELDING AND PRODUCTS THEREOF

BACKGROUND OF THE INVENTION

1. Field of the Invention

This invention relates generally to welding methods and products, and more specifically to methods for repair of single crystal superalloys by laser welding and products thereof.

2. Description of the Related Art

In the past, nickel-based superalloys have been widely used for applications in which resistance to high temperatures is required. Such applications are largely found in the hot-section parts of gas turbine engines. Improvements in manufacturing methods have led to casting of components in single crystal form giving better high temperature lives and strength than their equiaxed, poly-crystalline counterparts. Over time, such components (particularly turbine blades) would be damaged or degraded due to erosion, corrosion, oxidation and thermal fatigue, and require repair or restoration. Amongst other causes were the fuel gas used in power generation gas turbines which contain many compounds such as sodium sulfate and sodium chloride, etc., which promote high temperature corrosion and oxidation of turbine blades.

The efficiency of gas turbine engines depends in part on the ability to minimize leakage of compressed air between the turbine blades and the shrouds of the engine's turbine section. During service operation, as noted above, turbine blade tips and vane air foils are eroded and worn due to severe oxidation, corrosion and foreign particle impact, and such damaged components become scrapped parts. It is therefore advantageous to repair components if at all possible.

However, because these components comprise superalloys having high strength, but low ductility properties, cracks would be induced during welding. The cracks would propagate rapidly under stress resulting in unusable parts. Superalloys are principally strengthened through controlled heat treatment producing $Ni_3(Al, Ti)$ precipitates known as gamma-prime. The precipitation hardening phenomena and the associated volumetric changes that occur upon aging facilitates cracking and makes welding of these alloys very difficult.

As a result of the high temperatures involved in welding, there is a need for an improved process permitting superalloy parts to be joined with other parts of similar alloy composition while maintaining the strength and ductility properties of both the parts and the integrity of the bond that is thereby formed. An improved process for coating existing parts that have corroded, as discussed above, is also desirable.

For the foregoing reasons, it is desirable to provide improved methods for repair of single crystal superalloys by laser welding and products thereof.

SUMMARY OF THE INVENTION

In order to restore both dimension and geometry of damaged hot section components such as turbine blades and nozzle guide vanes and maintain elevated-temperature properties (both environment-resistant and creep-resistant properties, etc.), advanced superalloy filler materials are laser deposited onto worn or damaged areas of the components. Thus damaged advanced turbine superalloy (directionally solidified and single crystal cast) components are completely repaired and restored to their original geometry and dimension with excellent elevated-temperature properties. The process of this invention can be used to repair hot section advanced turbine superalloy (directionally solidified and single crystal cast) components (turbine blades, vanes and nozzles) in both aerospace and land-based turbine industries.

In accordance with an embodiment of the present invention a method for welding single crystal superalloys is disclosed. A high power energy source is used to both preheat and fully melt a filler which comprises a superalloy and to cause shallow melting of at least a portion of a surface of a substrate which comprises a single crystal superalloy. The filler is deposited onto the portion of the surface of the substrate to form a solid clad on the substrate to provide a superalloy weld. The high power energy source is a laser.

In accordance with another embodiment a method for welding single crystal superalloys comprises providing a substrate to be treated. The substrate comprises a single crystal superalloy and a filler, which comprises a superalloy is provided. The filler is exposed to a high power energy source to cause preheating and melting of the filler by the high power energy source. A portion of a surface of the substrate is exposed to the high power energy source to cause shallow melting of the portion of the surface of the substrate by the high power energy source. The filler is deposited onto the portion of the melted surface of the substrate to form a solid clad on the substrate to provide a superalloy weld.

The substrate is selected from at least one of the group consisting of SC 180, RENÉ N5 and N6, CMSX-2, CMSX-4 and CMSX-10, and PWA 1480 and 1484. The substrate comprises elements selected from at least one of the group consisting of Ni, Co, Cr, Mo, W, Ta, Al, Ti, Re, Nb, Hf, C and B.

The filler is selected from at least one of the group consisting of HS-188, HASTELLOY X, INCO 713, INCO 738, INCO 939, MAR-M247, RENÉ 80, C 101 and modified MCrAlY. The modified MCrAlY is modified with an element selected from at least one of the group consisting of Pt, Pd, Re, Ta, Hf, Zr, Si, C and B. The M of the MCrAlY is selected from at least one of the group consisting of Ni, Co and Fe or combination thereof. The filler comprises elements selected from at least one of the group consisting of Ni, Co, Fe, Cr, W, Mo, Al, Si, Nb, Ti, Ta, Zr, Re, Hf, C, B, Y and La.

The filler is fed through a co-axial nozzle of the high power energy source. The filler and the portion of the surface of the substrate are shrouded with an inert gas and rapid relative motion of the beam of the high power energy source to an adjacent portion of the surface of the substrate allows a solid clad to form.

The filler in the form of a powder is fed by a powder feeder into the co-axial nozzle. The powder is fed by the powder feeder at a rate of about 1.5–20 grams per minute. Preferably, the powder is fed by the powder feeder at a rate of about 1.5–10 grams per minute. Alternatively, the filler comprises a wire or combination of wire and powder.

The rapid relative motion of the beam of the high energy power source is preferably caused at a speed of about 5–22 inches per minute relative to the adjacent portion of the surface of the partially melted substrate. Preferably, the rapid relative motion of the beam of the high energy power source is caused at a speed of about 5–14 inches per minute relative to the adjacent portion of the surface of the partially melted substrate.

The high energy power source comprises a laser. The laser is selected from at least one of the group consisting of carbon dioxide, Nd:YAG, diode and fiber lasers. The laser has a power of about 50–2500 watts. Preferably, the laser has a power of about 50–1500 watts. A laser beam of the laser is defocused by about 0.02–0.1 inches. Preferably, a laser beam of the laser is defocused by about 0.04–0.06 inches. The laser produces a laser-welded clad bead having a width of about 0.02–0.100 inches. Preferably, the laser produces a laser-welded clad bead having a width of about 0.04–0.06 inches.

In accordance with yet another embodiment a method for repairing a portion of a surface of a single crystal superalloy substrate is disclosed. A welded single crystal superalloy is prepared according to the method. A single crystal superalloy substrate having a surface defect and a superalloy filler are provided. The filler is exposed to a laser source to cause preheating and melting of the filler by the laser source. A portion of a defective surface of the substrate is exposed to the laser source to cause melting of the portion of the defective surface of the substrate by the laser source. The filler is deposited onto the portion of the defective surface of the substrate to form a solid clad on the portion of the defective surface of the substrate to provide a superalloy repair of the surface defect of the substrate.

The filler is fed through a co-axial nozzle of the laser source. The filler and the portion of the defective surface of the substrate are shrouded with an inert gas and rapid relative motion of a beam of the laser source to an adjacent portion of the surface of the substrate allows a solid clad to form. The filler is in the form of a powder and the filler is fed by a powder feeder into the co-axial nozzle.

In accordance with another embodiment a method for coating the surface of a single crystal superalloy substrate is disclosed. A portion of a surface of a single crystal superalloy substrate is selected to be treated and an advanced superalloy filler is provided. The filler is exposed to a laser source to cause preheating and melting of the filler by the laser source and the portion of the surface of the substrate is exposed to the laser source to cause melting of the portion of the surface of the substrate by the laser source. The filler is deposited to form a solid clad onto the portion of the surface of the substrate to provide an epitaxial coating on the surface of the substrate.

The filler is fed through a co-axial nozzle of the laser source and the filler and the portion of the surface of the substrate are shrouded with an inert gas. Rapid relative motion of a beam of the laser source to an adjacent portion of the surface of the substrate allows a solid clad to form. The filler in the form of a powder is fed by a powder feeder into the coaxial nozzle.

According to yet another embodiment a method for laser-welding a single crystal superalloy substrate is disclosed. A substrate comprising a single crystal superalloy is selected from at least one of the group consisting of SC 180, RENÉ N5 and N6, CMSX-2, CMSX-4 and CMSX-10, and PWA 1480 and 1484. The substrate comprises at least elements selected from the group consisting of Ni, Co, Cr, Mo, W, Ta, Al, Ti, Re, Nb, Hf, C and B.

A filler is selected from at least one of the group consisting of a powder and a wire.

The filler comprises an advanced superalloy filler material selected from at least one of the group consisting of HS-188, HASTELLOY X, INCO 713, INCO 738, INCO 939, MAR-M247, RENÉ 80, C 101 and modified MCrAlY. The MCrAlY is modified with at least an element selected from at least one of the group consisting of Pt, Pd, Re, Ta, Hf, Zr, Si, C and B. The M is selected from at least one of the group consisting of Ni, Co and Fe.

The filler is exposed to a laser source to cause preheating and melting of the filler by the laser source. The laser source is selected from at least one of the group consisting of carbon dioxide, Nd:YAG, diode and fiber lasers. The filler comprises elements selected from at least one of the group consisting of Ni, Co, Fe, Cr, W, Mo, Al, Si, Nb, Ti, Ta, Zr, Re, Hf, C, B, Y and La. The laser source has a power of about 50–1500 watts and includes a laser beam defocused by about 0.04–0.06 inches.

A portion of a surface of the substrate is exposed to the laser source to cause partial melting of the portion of the surface of the substrate. The preheated and melted filler is deposited onto the portion of the melted surface of the substrate to form an epitaxial clad bead having a width of about 0.04–0.06 inches on the portion of the surface of the substrate. The preheating and melting of the filler by the laser source is achieved by feeding the filler through a co-axial nozzle of the laser source. The powder is fed by a powder feeder into the co-axial nozzle at a rate of about 1.5 to about 10 grams per minute and the preheated and melted filler and the portion of the surface of the melted substrate are shrouded with an inert gas selected from at least one of the group consisting of He and Ar. Rapid relative motion of a beam of the laser source at a speed of about 5 to about 14 inches per minute to an adjacent portion of the surface of the partially melted substrate provides an epitaxial superalloy weld.

A laser-welded single crystal superalloy is prepared according to the method.

The foregoing and other objects, features, and advantages of the invention will be apparent from the following, more particular, description and drawings of the preferred embodiments of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DESCRIPTION OF THE PREFERRED EMBODIMENT(S)

The high strength gamma prime precipitation-strengthened nickel base superalloys are generally described as those which have high strength even at temperatures of 1600° F.

or higher. Generally, these superalloys have an ultimate tensile strength of at least 125 Ksi at 1200° F. and at least 100 Ksi at 1600° F., a yield strength at 0.2% offset of at least 100 Ksi at 1200° F. and at least 70 Ksi at 1600° F., and a rupture strength (1000 hour) of at least 25 Ksi at 1600° F. (see SUPERALLOYS II, edited by Sims, et al., John Wiley & Sons, 1987, pages 581–586).

Table 1 shows nominal compositions of some first generation single crystal superalloys and Table 2 shows nominal compositions of some second generation single crystal superalloys that may be used in this invention. More specifically, for example, PWA 1480 (a first generation superalloy) has a density of 8.70 Kg/dm$^3$ and a temperature capability based on 100 hour to rupture at 140 MPa of 1060° F. In comparison, PWA 1484 (a second generation superalloy) has a density of 8.95 Kg/dm$^3$ and a temperature capability based on 100 hour to rupture at 140 MPa of 1100° F. (see G. L. Erickson, "Superalloys Resist Hot Corrosion and Oxidation", Advanced Materials and processes, 3, 1997, pages 27–30).

TABLE 1

Nominal Compositions of Some First Generation Single Crystal Superalloys.

| Element | First Generation Single Crystal Superalloy | | | |
| --- | --- | --- | --- | --- |
| | PWA 1480 | PWA 1483 | RENÉ N4 | CMSX-2 |
| Co | 5.0 | 9.0 | 7.5 | 5.0 |
| Cr | 10.0 | 12.8 | 9.8 | 8.0 |
| Mo | — | 1.9 | 1.5 | 0.6 |
| W | 4.0 | 3.8 | 6.0 | 8.0 |
| Ta | 12.0 | 4.0 | 4.8 | 6.0 |
| Al | 5.0 | 3.6 | 4.2 | 5.6 |
| Ti | 1.5 | 4.0 | 3.5 | 1.0 |
| Re | — | — | — | — |
| Nb | — | — | 0.5 | — |
| Hf | — | — | 0.15 | — |
| C | — | — | 0.06 | — |
| B | — | — | 0.004 | — |
| Ni | Balance | Balance | Balance | Balance |

TABLE 2

Nominal Compositions of Some Second Generation Single Crystal Superalloys.

| Element | Second Generation Single Crystal Superalloy | | | |
| --- | --- | --- | --- | --- |
| | PWA 1484 | RENÉ N5 | CMSX-4 | SC-180 |
| Co | 10.0 | 8.0 | 9.0 | 10.0 |
| Cr | 5.0 | 7.0 | 6.5 | 5.0 |
| Mo | 2.0 | 2.0 | 0.6 | 2.0 |
| W | 6.0 | 5.0 | 6.0 | 5.0 |
| Ta | 9.0 | 7.0 | 6.5 | 8.5 |
| Al | 5.6 | 6.2 | 5.6 | 5.2 |
| Ti | — | — | 1.0 | 1.0 |
| Re | 3.0 | 3.0 | 3.0 | 3.0 |
| Nb | — | — | — | — |
| Hf | 0.1 | 0.2 | 0.1 | 0.1 |
| C | — | 0.06 | — | — |
| B | — | 0.004 | — | — |
| Ni | Balance | Balance | Balance | Balance |

Figure 1:
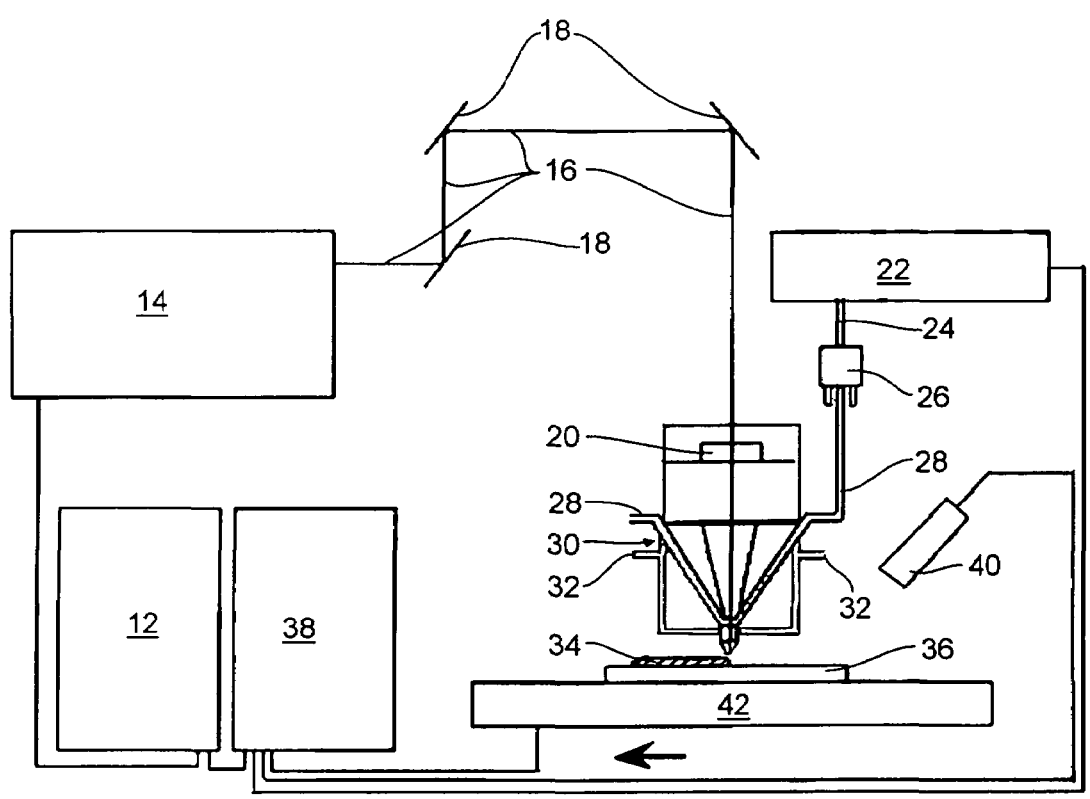
FIG. 1 is a block diagram and side elevation view of an automated laser welding system that is used for welding single crystal substrates with superalloy fillers according to the invention.

FIG. 1 illustrates a block diagram for an automated laser welding fixture suitable for this invention. The method utilizes laser fusing techniques, superalloy powder or superalloy wires and computerized numerical control of a target single crystal superalloy substrate. A laser controller 12 drives a laser 14 producing a laser beam 16, which is reflected by mirrors 18 into a laser focus lens 20, resulting in focusing of the laser beam 16 and irradiation of a portion of a surface of a single crystal superalloy substrate 36. At least one screw powder feeder 22 transports a superalloy powder stream (not shown) through a multiplicity of delivery tubes 24 to a powder splitter 26 with a pressurized inert gas (not shown) such as argon or helium. The superalloy powder stream is split into smaller superalloy powder streams, which are delivered into a coaxial laser nozzle 30 through a multiplicity of connection tubes 28 to form a cone-shaped superalloy powder stream. An inert gas shield (not shown) is fed through openings 32 into the co-axial laser nozzle 30. The inert gas shield is directed onto a portion of the surface of the single crystal superalloy substrate 36 during laser welding. The laser beam 16 interacts with the superalloy powder stream, and preheats and melts the superalloy powder stream. Concurrently, the laser beam 16 melts a portion of the surface of the single crystal superalloy substrate 36. When the preheated and melted superalloy powder stream is fed onto the melted portion of the surface of the single crystal superalloy substrate 36 a superalloy clad 34 is formed on the surface of the single crystal superalloy substrate 36 resulting in a weld. A computerized numerical controller 38 drives motion of a substrate positioning table 42 aided by a visioning system 40 for locating the single crystal superalloy substrate 36 and for laser positioning control. Superalloy wire may be used in place of superalloy powder by providing a different feed mechanism for the filler. A hand held laser welding torch may also be utilized.

The types of lasers that may be used for practicing the invention include $CO_2$ (carbon dioxide), Nd:YAG, diode and fiber lasers. The laser power may be about 50 to about 2500 watts and more preferably about 50–1500 watts. The powder feed rate is about 1.5 to about 20 grams per minute and more preferably about 1.5 to about 10 grams per minute. Traveling speed for relative motion of the substrate positioning table 42 relative to the laser beam 16 is about 5 to about 22 inches per minute and more preferably about 5–14 inches per minute. The size of the defocused laser beam 16 is about 0.02 to about 0.1 inches and more preferably about 0.04 to about 0.06 inches. The laser-welded bead width is about 0.02 to about 0.100 inches and more preferably about 0.04–0.06 inches. Multiple passes may be used to build up thicknesses of material.

Some superalloy filler materials that are suitable for the practice of this invention and that are commercially available in powder and wire form include: HS-188, HASTELLOY X, INCO 713, INCO 738, INCO 939, MAR-M247, RENÉ 80, C 101 and modified MCrAlY (modified with one or a combination of Pt, Pd, Re, Ta, Hf, Zr, Si, C and B; where M is selected from the group consisting of Ni, Co and Fe). Some single crystal base superalloys, which are suitable for the practice of this invention and may be laser welded include: SC 180, RENÉ N5 and N6, CMSX-2, CMSX-4 and CMSX-10, and PWA 1480 and 1484.

Figure 2:
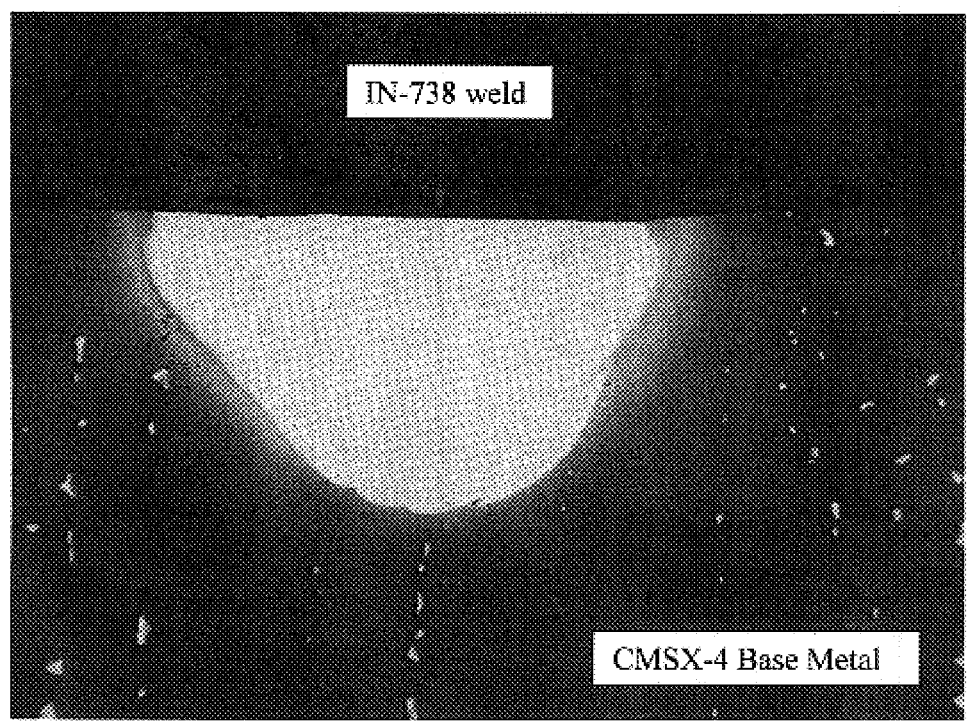
FIG. 2 is a cross-sectional optical photomicrograph at a 50× magnification of the result of laser welding INCO 738 superalloy inside a U-groove in a repair of a CMSX-4 single crystal superalloy substrate.

Referring to FIG. 2, a cross-sectional optical photomicrograph at a 50× magnification shows the result of laser-welding INCO 738 superalloy filler inside a U-groove on a CMSX-4 single crystal superalloy substrate. This simulates a crack healing repair of an advanced superalloy airfoil and FIG. 2 shows a clean weld.

Figure 3:
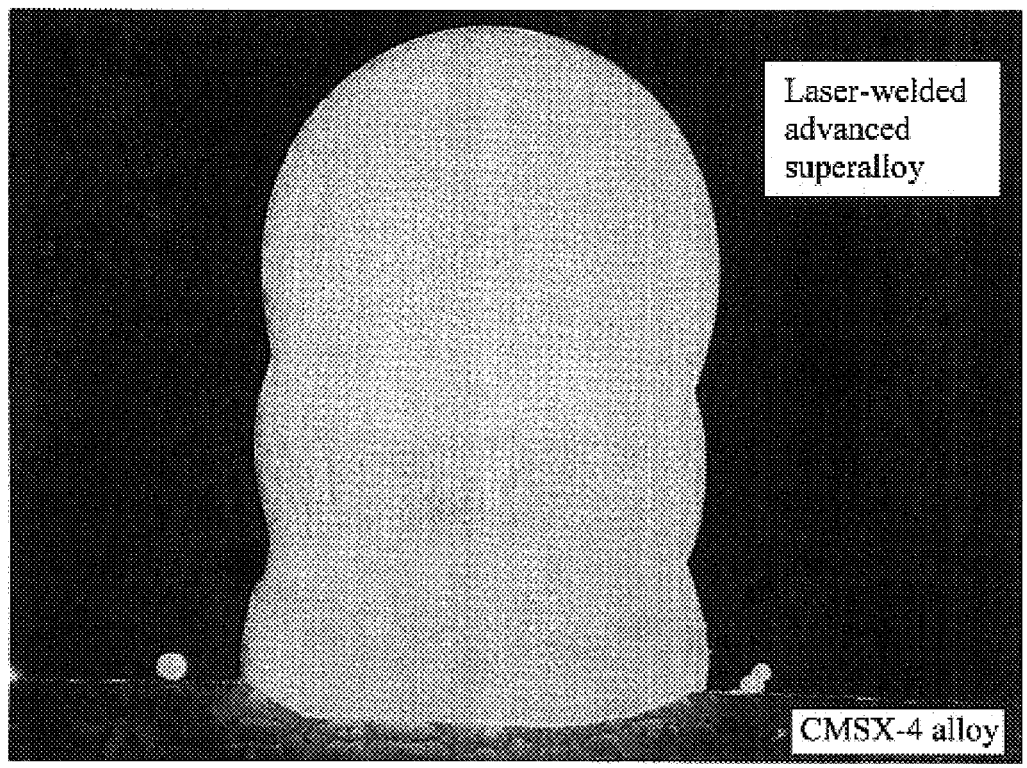
FIG. 3 is a cross-sectional optical photomicrograph at a 50× magnification of an advanced superalloy filler deposited on a portion of a surface of a CMSX-4 single crystal superalloy substrate.

FIG. 3 is a cross-sectional optical photomicrograph at a 50× magnification of an advanced superalloy filler deposited on a portion of a surface of a CMSX-4 single crystal superalloy substrate. This simulates a tip and platform repair where the filler is built up on the surface of the CMSX-4 single crystal superalloy substrate and FIG. 3 shows a clean weld between the laser-welded advanced superalloy and the CMSX-4 single crystal superalloy.

Figure 4:
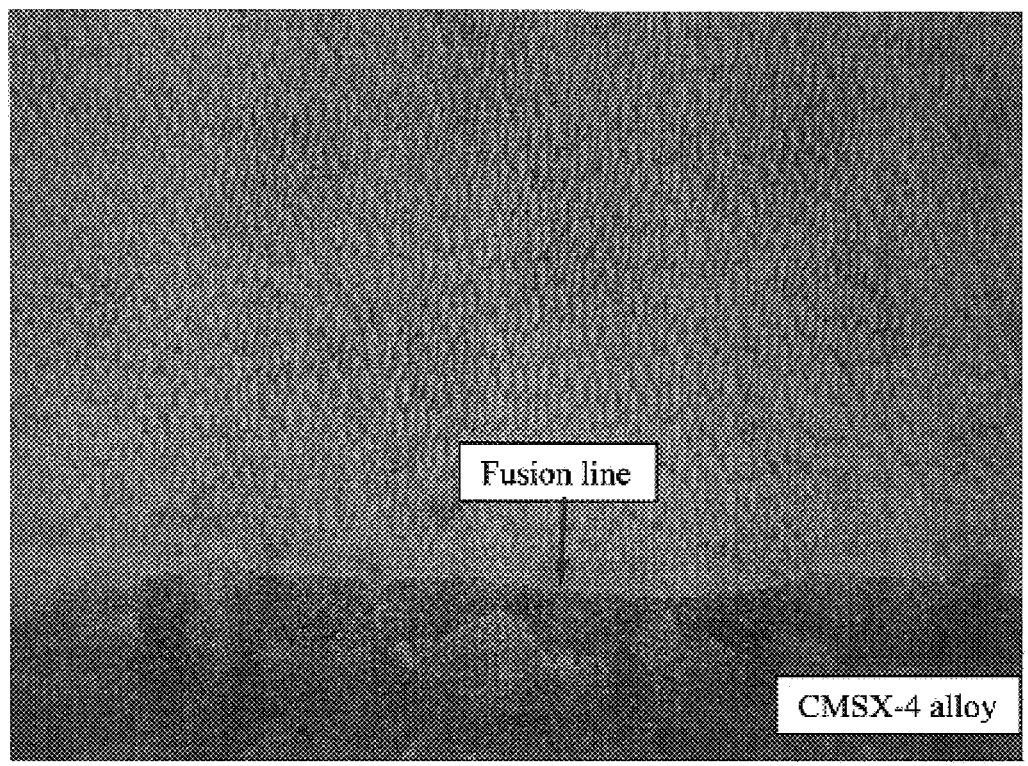
FIG. 4 is a cross-sectional optical photomicrograph at a 200× magnification of a portion of the optical photomicrograph of FIG. 3 at the fusion line between the laser-welded superalloy filler and the CMSX-4 single crystal superalloy substrate.

FIG. 4 is a cross-sectional optical photomicrograph at a 200× magnification of a portion of the optical photomicrograph of FIG. 3 at the fusion line between the laser-welded superalloy filler and the CMSX-4 single crystal superalloy substrate. FIG. 4 shows epitaxial growth microstructure.

The laser repair method disclosed herein may be used advantageously in a number of applications, including, but not limited to: crack-healing repair on airfoils; cast defect repairs; tip, tip knife seal and platform repairs; and leading and/or trailing edge repairs.

In summary, methods for repair of single crystal superalloys by laser welding and products thereof have been disclosed. The laser process may be finished by hand held welding torch or automated welding system. Laser types include: $CO_2$, Nd:YAG, diode and fiber lasers. Parameters for operating the laser process are disclosed. Filler materials, which may be either wire or powder superalloys are used to weld at least one portion of a single crystal superalloy substrate.

While the invention has been particularly shown and described with reference to preferred embodiments thereof, it will be understood by those skilled in the art that the foregoing and other changes in form and details may be made therein without departing from the spirit and scope of the invention. For example, advanced superalloys may be used as both welding fillers and gas turbine hardware materials. The laser welding process may be used to restore gas turbine component dimensions by using multiple passes to form near-net shapes of various kinds. The laser welding process may be used to apply environment-resistant coatings to single crystal superalloy substrates.

What is claimed is:

1. A method for welding single crystal superalloys comprising the steps of:
   using a high power energy source to both preheat and melt a filler comprising modified MCrAlY and to cause melting of at least a portion of a surface of a substrate comprising a single crystal superalloy; and
   depositing said filler onto the portion of the surface of the substrate to form a solid clad on the substrate to provide a superalloy weld.

2. The method for welding single crystal superalloys of claim 1 wherein said high power energy source is a laser.

3. A method for welding single crystal superalloys comprising the steps of:
   providing a substrate to be treated, said substrate comprising a single crystal superalloy;
   providing a filler, said filler comprising a superalloy;
   exposing said filler to a high power energy source to cause preheating and melting of said filler by said high power energy source, the high power energy source being a laser selected from the group consisting of carbon dioxide. Nd:YAG, diode and fiber lasers;
   exposing a portion of a surface of said substrate to said high power energy source to cause partial melting of the portion of the surface of said substrate by said high power energy source; and
   depositing said filler onto the portion of the melted surface of said substrate to form a solid clad on said substrate to provide a superalloy weld.

4. The method for welding single crystal superalloys according to claim 3 further comprising the step of:
   providing said substrate comprises elements selected from at least one of the group consisting of Ni, Co, Cr, Mo, W, Ta, Al, Ti, Re, Nb, Hf, C and B.

5. The method for welding single crystal superalloys according to claim 3 wherein said filler comprises modified MCrAlY.

6. The method for welding single crystal superalloys according to claim 5 wherein said modified MCrAlY is modified with an element selected from at least one of the group consisting of Pt, Pd, Re, Ta, Hf, Zr, Si, C and B.

7. The method for welding single crystal superalloys according to claim 5 wherein said M of said MCrAlY is selected from at least one of the group consisting of Ni, Co and Fe or combination thereof.

8. The method for welding single crystal superalloys according to claim 3 further comprising the step of:
   providing said filler comprises an element selected from at least one of the group consisting of Ni, Co, Fe, Cr, W, Mo, Al, Si, Nb, Ti, Ta, Zr, Re, Hf, C, B, Y and La.

9. The method for welding single crystal superalloys according to claim 3 further comprising the steps of:
   feeding said filler through a co-axial nozzle of said high power energy source;
   shrouding said filler and the portion of the surface of said substrate with an inert gas; and
   causing rapid relative motion of a beam of said high power energy source to an adjacent portion of the surface of said substrate allowing a solid clad to form.

10. The method for welding single crystal superalloys according to claim 9 further comprising the step of:
    providing said filler in the form of a powder; and providing a powder feeder for feeding said powder of said filler into said co-axial nozzle.

11. The method for welding single crystal superalloys according to claim 10 wherein said powder is fed by powder feeder at a rate of about 1.5 to about 20 grams per minute.

12. The method for welding single crystal superalloys according to claim 10 wherein said powder is fed by said powder feeder at a rate of about 1.5 to about 10 grams per minute.

13. The method for welding single crystal superalloys according to claim 9 wherein said rapid relative motion of said beam of said high energy power source is caused at a speed of about 5 to about 22 inches per minute relative to the adjacent portion of the surface of said melted substrate.

14. The method for welding single crystal superalloys according to claim 9 wherein said rapid relative motion of said beam of said high energy power source is caused at a speed of about 5 to about 14 inches per minute relative to the adjacent portion of the surface of said partially melted substrate.

15. The method for welding single crystal superalloys according to claim 3 wherein said filler comprises a wire.

16. The method for welding single crystal superalloys according to claim 3 wherein said laser has a power of about 50 to about 2500 watts.

17. The method for welding single crystal superalloys according to claim 3 wherein said laser has a power of about 50 to about 1500 watts.

18. The method for welding single crystal superalloys according to claim 3 wherein a laser beam of said laser is defocused by about 0.02 to about 0.1 inches.

19. The method for welding single crystal superalloys according to claim 3 wherein a laser beam of said laser is defocused by about 0.04 to about 0.06 inches inches.

20. The method for welding single crystal superalloys according to claim 3 wherein said laser produces a laser-welded clad bead having a width of about 0.02 to about 0.1 inches.

21. The method for welding single crystal superalloys according to claim 3 a wherein said laser produces a laser-welded clad bead having a preferable width of about 0.04 to about 0.06 inches.

22. A welded single crystal superalloy prepared according to the method of claim 3.

23. A method for repairing a portion of a surface of a single crystal superalloy substrate comprising the steps of:
    providing a single crystal superalloy substrate having a surface defect;
    providing a superalloy filler;
    exposing said filler to a laser source to cause preheating and melting of said filler by said laser source, the laser source being selected from the group consisting of carbon dioxide, Nd:YAG, diode and fiber lasers;
    exposing a portion of a defective surface of said substrate to said laser source to cause melting of the portion of the defective surface of said substrate by said laser source; and
    depositing said filler onto the portion of the defective surface of said substrate to form a solid clad on the portion of the defective surface of said substrate to provide a superalloy repair of said surface defect of said substrate.

24. The method for repairing the surface of a single crystal superalloy substrate according to claim 23 further comprising the steps of:
    feeding said filler through a co-axial nozzle of said laser source;
    shrouding said filler and the portion of the defective surface of said substrate with an inert gas; and
    causing rapid relative motion of a beam of said laser source to an adjacent portion of the surface of said substrate allowing a solid clad to form.

25. The method for repairing the surface of a singe crystal superalloy substrate according to claim 24 further comprising the steps of:
    providing said filler in the form of a powder; and providing a power feeder for feeding said powder of said filler into said co-axial nozzle.

26. A method for coating the surface of a single crystal superalloy substrate comprising the steps of:
    selecting a portion of a surface of a single crystal superalloy substrate to be treated;
    providing a filler comprising modified MCrAlY;
    exposing said filler to a laser source to cause preheating and melting of said filler by said laser source;
    exposing the portion of the surface of said substrate to said laser source to cause melting of the portion of the surface of said substrate by said laser source; and
    depositing said filler to form a solid clad onto the portion of the surface of said substrate to provide a single crystal superalloy coating on the surface of said substrate.

27. The method for coating the surface of a single crystal superalloy substrate according to claim 26 further comprising the steps of:
    feeding said filler through a co-axial nozzle of said laser source;
    shrouding said filler and the portion of the surface of said substrate with an inert gas; and
    causing rapid relative motion of a beam of said laser source to an adjacent portion of the surface of said substrate allowing a solid clad to form.

28. The method for coating the surface of a single crystal superalloy substrate according to claim 27 further comprising the step of:
    providing said filler in the form of a powder; and
    providing a power feeder for feeding said powder of said filler into said co-axial nozzle.

\* \* \* \* \*